United States Patent [19]
Arrington et al.

[11] Patent Number: 6,063,481
[45] Date of Patent: May 16, 2000

[54] PROCESS FOR REMOVAL OF UNDERSIRABLE CONDUCTIVE MATERIAL ON A CIRCUITIZED SUBSTRATE AND RESULTANT CIRCUITIZED SUBSTRATE

[75] Inventors: Edward Lee Arrington; John Christopher Camp, both of Owego; Robert Jeffrey Day, Dryden; Edmond Otto Fey, Vestal; Curtis Michael Gunther, Apalachin; Thomas Richard Miller, Endwell, all of N.Y.

[73] Assignee: International Business Machines Corporation, Armonk, N.Y.

[21] Appl. No.: 09/036,065

[22] Filed: Mar. 6, 1998

Related U.S. Application Data

[62] Division of application No. 08/813,765, Mar. 7, 1997.

[51] Int. Cl.$^7$ .............................. B32B 3/00; B32B 15/04
[52] U.S. Cl. .................. 428/209; 174/256; 428/647; 428/668; 428/669; 428/457; 428/601; 428/901
[58] Field of Search .................... 428/209, 620, 428/647, 668, 671, 675, 687, 457, 601, 901; 205/125; 29/829; 174/256

[56] References Cited

U.S. PATENT DOCUMENTS

| | | | |
|---|---|---|---|
| 4,144,118 | 3/1979 | Stahl | 428/901 |
| 4,430,154 | 2/1984 | Stahl et al. | 216/83 |
| 4,632,857 | 12/1986 | Mallory, Jr. | 428/209 |
| 4,718,972 | 1/1988 | Babu et al. | 427/95 |
| 4,874,635 | 10/1989 | Karas et al. | 427/96 |
| 5,009,714 | 4/1991 | Arrington et al. | 134/2 |
| 5,084,299 | 1/1992 | Hirsch et al. | 216/87 |
| 5,213,841 | 5/1993 | Gulla et al. | 427/96 |
| 5,302,492 | 4/1994 | Ott et al. | 427/96 |

Primary Examiner—Timothy Speer
Assistant Examiner—Robert R. Koehler
Attorney, Agent, or Firm—Schmeiser, Olsen & Watts; Lawerence R. Fraley

[57] ABSTRACT

A process for removal of undesirable conductive material (e.g., catalyst material and seeped circuit material) on a circuitized substrate and the resultant circuitized substrates disclosed. Such process and resultant circuit effectively address the electrical shorting problems caused by nonremoval of the residual catalyst material and circuit material which has seeped under the residual catalyst material. The process includes the steps of: a) providing a catalyst layer (e.g., palladium and tin) having circuit pattern (e.g., copper) thereon; b) pretreating the catalyst layer and the circuit pattern (e.g., with a cyanide dip) for removal of undesirable portions of each which cause electrical leakage between circuit lines of the circuit pattern; c) oxidizing the catalyst layer and the circuit pattern (e.g., with chlorite, permanganate, hydrogen peroxide, or air at a temperature elevated above ambient conditions); and d) removing the undesirable portions of the catalyst layer and the undesirable portions of the circuit pattern (e.g., with a cyanide submersion). The resultant circuitized substrate includes a circuit pattern on a catalyst layer wherein undesirable portions of the catalyst layer and circuit pattern are completely removed between the circuit features of the circuit pattern so that electrical leakage between the circuit features does not occur.

9 Claims, 1 Drawing Sheet

PROCESS FOR REMOVAL OF UNDERSIRABLE CONDUCTIVE MATERIAL ON A CIRCUITIZED SUBSTRATE AND RESULTANT CIRCUITIZED SUBSTRATE

This application is a divisional of co-pending application Ser. No. 08/813,765, filed Mar. 7, 1997.

BACKGROUND OF THE INVENTION

1. Field of the Invention

The present invention relates generally to circuitized substrates and more specifically to a process for removal of undesirable conductive material (e.g., a catalyst layer) on a printed circuit and the resultant printed circuit.

2. Description of the Related Art

In the manufacture of printed circuit boards, a conductive circuit pattern is provided on at least one surface of a dielectric substrate. The circuit pattern can be formed on the substrate using a variety of known techniques. One of the better known techniques includes the electroless direct bond (EDB) technique, wherein copper is electrolessly plated directly onto the surface of the substrate in a desired pattern. The circuit pattern may include conductor lines on the surface of the substrate as well as in holes (often referred to as plated through holes) which connect one or more of the conductive layers together. Since the dielectric substrate is non-conductive, it is generally necessary to catalyze the substrate prior to deposition of the conductive metal onto the substrate. Among the more widely employed procedures for catalyzing is to deposit colloidal particles of palladium (Pd) and tin (Sn) onto the substrate. A resist layer is then applied over the catalyst layer. A circuit pattern is formed by first removal of portions of the resist through masking techniques. Then, a copper metallic coating can then be applied to the exposed catalyzed areas or areas where the resist has been removed by way of known processing such as electroless deposition techniques to form the circuit pattern. Following the electroless deposition of the metallic coating, the remaining resist is removed.

One of the difficulties not adequately addressed heretofore occurs after the remaining resist has been removed, a residual catalyst layer (e.g., tin and palladium layer) remains between the circuit features (e.g. lines) of the circuit pattern. The term "residual" as used hereinafter, refers to undesirable material between circuit features of the circuit pattern. Another difficulty is that when the catalyst layer has a circuit pattern deposited thereon, trace amounts of the circuit material (e.g., copper) in the circuit pattern, seep under the resist into the residual catalyst layer which causes further electrical shorting. If the catalyst layer and residual circuit material are not adequately removed, electrical shorting between the circuit features of the finished circuit pattern occurs due to the residual catalyst material and residual seeped circuit material (e.g., copper).

U.S. Pat. No. 4,718,972 assigned to International Business Machines Corporation discloses one proposed method of making a PCB wherein metallic seed (catalyst) particles are applied to a surface of a substrate. An image of the desired conductor pattern is defined by a maskant layer to permit the subsequent electroless deposition of the conductor material upon the exposed seeded areas of the substrate. Then, the substrate surface is subjected to a plasma discharge to facilitate removal of the seed particles. This method, however, has not provided complete removal of the catalyst and seeped circuit material between the circuit features.

Heretofore, the related art does not disclose complete removal of the residual catalyst material and residual seeped circuit material. If the residual catalyst layer and circuit material are not completely removed, they result in yield losses because of the shorts created. Such a decrease in product yield becomes quite costly when processing large amounts of circuitized substrates.

SUMMARY OF THE INVENTION

The present invention is a process for removal of undesirable conductive material (e.g., catalyst material and seeped circuit material) on a circuitized substrate (e.g., printed circuit board (PCB)) and the resultant printed circuit.

It is an object of the present invention to provide a process and resultant circuit which effectively address the electrical shorting problems caused by nonremoval of the residual catalyst material and seeped circuit material.

It is a further object of the present invention to eliminate electrical shorting by completely removing residual catalyst and residual seeped circuit material.

It is a further object of the present invention to eliminate the need to scrap circuits due to shorting caused by the residual catalyst layer and residual seeped circuit material by completely removing the residual catalyst layer and residual seeped circuit material.

It is a further object of the present invention to increase product yield during processing of circuitized substrates thus resulting in a substantial cost benefit (on the order of over 1 million present value dollars industry wide).

It is a further object of the present invention to provide a process which has steps (e.g., pretreating residual material in cyanide, oxidizing, removing residual material in cyanide dip) to preferentially attack the residual catalyst layer and residual seeped circuit material without deleterious effects (e.g., excessive removal of circuit line material) to the surrounding circuit material and catalyst layer.

The process of the present invention for making a circuitized substrate includes the steps of: a) providing a catalyst layer (e.g., palladium and tin) having a circuit pattern (e.g., copper) thereon; b) pretreating the catalyst layer and the circuit pattern (e.g., with a cyanide dip) for removal of undesirable portions of the catalyst layer and the circuit pattern which cause electrical leakage between circuit lines of the circuit pattern; c) oxidizing the catalyst layer and the circuit pattern (e.g., with chlorite, permanganate, hydrogen peroxide, or air at a temperature elevated above ambient conditions); and d) removing the undesirable portions of the catalyst layer and the undesirable portions of the circuit pattern (e.g., with a cyanide dip). The circuitized substrate of the present invention includes a circuit pattern on a catalyst layer, wherein undesirable portions of the catalyst layer and circuit pattern are completely removed between the circuit features (e.g. lines, memory) of the circuit pattern so that electrical shorting between the circuit features does not occur. A circuit pattern is positioned on the catalyst layer, wherein undesirable portions of the catalyst layer and circuit pattern are removed between the circuit features of the circuit pattern so that electrical shorting between the circuit features does not occur.

BRIEF DESCRIPTION OF THE DRAWINGS

The preferred exemplary embodiment of the present invention will hereinafter be described in conjunction with the appended drawings, where like designations denote like elements, and.

DETAILED DESCRIPTION OF A PREFERRED EMBODIMENT OF THE PRESENT INVENTION

FIGS. 1–8 depict a process for removal of undesirable conductive material on a printed circuit and the resultant printed circuit. The undesirable conductive material is a catalyst material and circuit material that has seeped between the circuit lines under the catalyst material during processing. The undesirable conductive material causes electrical leakage problems if not removed.

Figure 1:
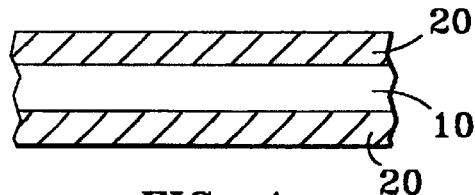
FIG. 1 is a cross-section through an inner layer of a multi-layer circuitized substrate during a preliminary processing according to a preferred embodiment of the present invention.
Figure 2:
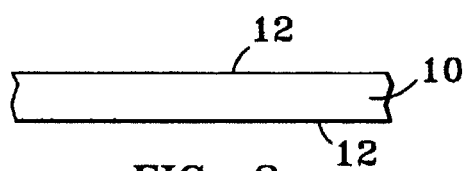
FIG. 2 is a perspective view of a cross-section of an inner layer of a multi-layer circuitized substrate during processing according to a preferred embodiment of the present invention.

FIGS. 1 and 2 show an optional step for preparing a surface of a substrate 10 before coating with a catalyst layer 22. The substrate may be any of a variety of dielectric substrates, including thermoplastic and thermosetting resins, glass and ceramics. Typical thermosetting polymeric materials include epoxy, phenolic base materials, polyimides, and fluoropolymers. The dielectric substrate may be molded from polymeric materials which may or may not include reinforcement. Presently, preferred substrates include epoxies, polyimides, and fluoropolymers. In particular, FIG. 1 depicts a substrate 10 laminated between two sheets of laminate or copper foil 20. Copper 20 may be deposited onto the substrate by a conventional technique such as electroless or electrolytic pattern plating. FIG. 2 shows the substrate 10 after the copper 20 has been removed therefrom by a conventional process such as etching. The copper 20 provides a sacrificial layer to roughen surfaces 12 of the substrate 10 for better adhesion of the catalyst layer 22.

Figure 3:
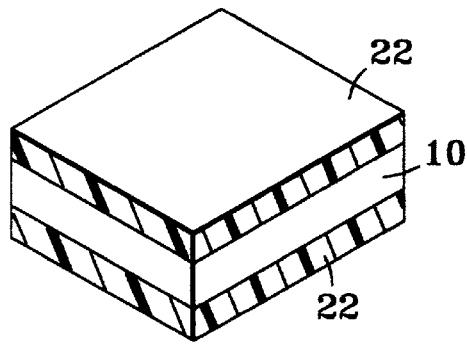
FIG. 3 is a cross-section through an inner layer of a multi-layer circuitized substrate after application of a catalyst layer during processing according to a preferred embodiment of the present invention.

FIG. 3 discloses a catalyst layer 22 deposited on the surface of the substrate 10. Preferably, the substrate 10 is dipped into a tank containing the catalyst material for approximately one minute. The tank leaves a film or coating of the catalyst material on the substrate 10 to form the catalyst layer 22. The catalyst layer 22 is preferably made of a colloidal precious metal and tin mixture such as palladium and tin. It is expected that catalyst, selected from periodic group VIII, and IVA may also be used in accordance with the present invention. While the catalyst layer 22 is depicted on both sides of the substrate 10, it should be understood that the catalyst layer 22 may alternatively be applied to a single side of the substrate 10 depending on whether a high or low packing density is desired. One exemplary process illustrating applying catalyst is more fully disclosed in U.S. Pat. No. 4,718,972, assigned to International Business Machines Corp., which patent is hereby incorporated in its entirety by reference.

Figure 4:
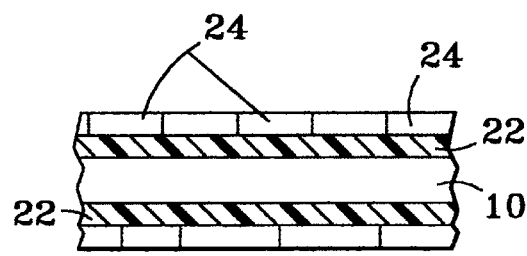
FIG. 4 is a cross-section through an inner layer of a multi-layer circuitized substrate after application of a resist layer during processing according to a preferred embodiment of the present invention.

In the next step, as shown in FIG. 4, a layer of photoresist 24 is applied on top of the catalyst layer 22. Any type of photoresist 24 may be used. For example, a dry film photoresist layer may be laminated onto the catalyzed substrate. Preferably, however, the maskant layer takes the form of a negative photoresist film which is laminated onto the substrate surface.

Figure 5:
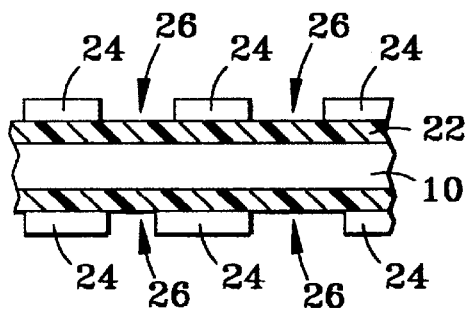
FIG. 5 is a cross-section through an inner layer of a multi-layer circuitized substrate after masking operations during processing according to a preferred embodiment of the present invention.
Figure 6:
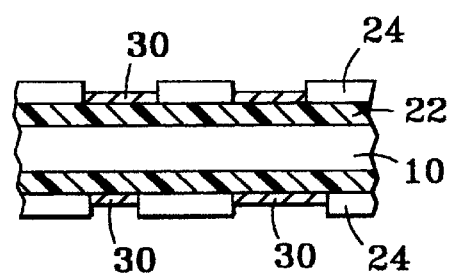
FIG. 6 is a cross-section through an inner layer of a multi-layer circuitized substrate during processing according to a preferred embodiment of the present invention.
Figure 7:
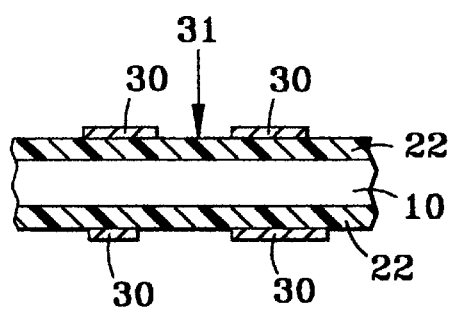
FIG. 7 is a cross-section through an inner layer of a multi-layer circuitized substrate during processing according to a preferred embodiment of the present invention.

Resist 24 is exposed, using any known process, with a negative mask which contains a pattern of conductor structures to be applied to the board. Thereafter, a positive image is developed according to methods known per se in the manufacture of circuitized substrates. The result is shown in FIG. 5, wherein the areas 26 between developed resist layer 24 denote parts of the pattern of the photoresist which correspond to a desired conductive pattern. Those portions of the catalyzed substrate not covered by the resist 24 can be plated, thereby creating circuit features 30 in the developed out regions, as shown in FIG. 6. The resist 24 is subsequently removed, exposing unplated catalyzed portions of the substrate, as shown in FIG. 7.

Figure 8:
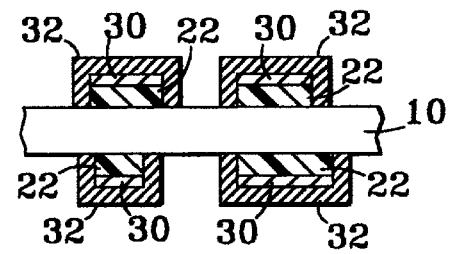
FIG. 8 is a cross-section through an inner layer of a multi-layer circuitized substrate after stripping of the catalyst layer during processing according to a preferred embodiment of the present invention.

Catalyst 22 and residual circuit materials 31 are then removed from the substrate surfaces located between circuit features 30 (e.g. circuit lines), as shown in FIG. 8. If the catalyst is not removed, it may nucleate metal deposition during subsequent process steps. The catalyst layer 22 and the residual circuit material 31 are removed in a three step process. Although the following three step process is disclosed, the exact processing parameters may be suitably varied in a manner which will be apparent to the skilled practitioner having the benefit of this patent. In a first step, catalyst layer 22 and residual circuit material 31 are pretreated by exposure to a solution such as a cupric chloride, hydrochloric acid, potassium cyanide, sodium cyanide or other cyanide compounds. The preferred solution contains cyanide solution such as potassium cyanide or sodium cyanide having concentrations of 0.5–3.0 grams/liter (g/l). These preferred solutions have proven effective in removing the residual catalyst layer 22 without significantly attacking the circuit material. Higher concentrations of cyanide (e.g., 60 g/l) may be used, however, this may not be desirable because high concentrations have a tendency to remove circuit material and may cause circuit failure. Removal of the residual catalyst layer 22 is difficult because the catalyst layer 22 has a relatively high surface roughness for adhesion of the conductive material. This pretreatment step removes only a portion of the catalyst layer 22. The pretreatment step includes placing the device into a bath for approximately 5 minutes to 2 hours and preferably for 30 minutes. The purpose of the pretreatment is to remove as much residual precious metal (e.g. palladium) as possible and prepare the circuit material for the oxidation step.

The second step is to treat the product in an oxidation step. The residual copper 31 is oxidized during the oxidation step, by exposure to oxidizing solutions or agents such as chlorite, permanganate, sulfuric acid/hydrogen peroxide, or exposure to oxygen in air at 125° Centigrade for approximately two hours. Temperatures above that may be detrimental to the glass transition temperature of the substrate 10. The exposure to the oxygen and the temperature may be varied depending upon the desired oxidation speed. This oxidation step is preparatory to the third step in that the cyanide reacts with and removes the seeped circuit material and catalyst layers, e.g., the palladium and tin.

The third step is another dip (preferably in cyanide) which removes the oxidized copper and remaining catalyst layer 22. This step results in the final conductive pattern without electrically conductive catalyst 22 material or residual copper material 31 therebetween. The time for the third dip depends upon the amount of conductive material that is to be removed. For example, large amounts of residual conductive material 31 (e.g., copper) would require a longer dip. The preferred dip time is between 5 minutes to 2 hours and preferably 30 minutes.

The final product may have a photosensitive protective layer or solder mask applied to the circuitized substrate or multi-layer package to cover the conductive traces and the portions of the board surface where no metal has been deposited. Alternatively, a solder mask may be laminated to the board, then exposed and developed prior to the step of chemical metal deposition. The solder pattern is selected such that the conductive traces and portions of the board where there is no metal are covered with solder stop, whereas solder pads and through holes are not covered. After the third step, the circuit pattern is covered with an additional metal layer 32, for example, copper, nickel, gold or nickel and gold. The effective complete removal of the catalyst layer eliminates electrical shorting when the circuit pattern is covered with additional metal layers 32. The additional metal layers 32 provide corrosion resistance, mechanical strength, longer shelf life and the ability to wire bond to the printed circuit.

While the invention has been described and illustrated with reference to specific embodiments, those skilled in the art will recognize that modification and variations may be made without departing from the principles of the invention as described herein above and set forth in the following claims.

What is claimed is:

1. A circuitized substrate comprising:

a circuit pattern, wherein circuit material is deposited onto a layer of catalyst material, and wherein areas of the substrate between the circuit pattern are completely void of any residual catalyst and circuit material so that electrical shorting does not occur.

2. The circuitized substrate of claim 1, wherein the catalyst material is a palladium and tin mixture.

3. The circuitized substrate of claim 1, further comprising a substrate beneath said catalyst material having a surface roughened by a sacrificial laminate.

4. The circuitized substrate of claim 3, wherein the sacrificial laminate comprises copper.

5. The circuitized substrate of claim 1, wherein said circuit pattern is a copper circuit pattern.

6. A computer apparatus comprising:

a plurality of circuit features on a substrate, wherein the circuit features contain a layer of catalyst material and a layer of circuit material thereon, and wherein no residual catalyst or circuit material remains on the substrate between the circuit features so that electrical leakage between the circuit lines does not occur.

7. The computer apparatus of claim 6, wherein the catalyst material is a palladium and tin mixture.

8. The computer apparatus of claim 6, wherein the substrate beneath said catalyst material has a surface roughened by a sacrificial laminate.

9. The computer apparatus of claim 7, wherein said circuit features are a copper circuit patterns.

* * * * *